(12) United States Patent
Järvinen

(10) Patent No.: US 7,400,865 B2
(45) Date of Patent: Jul. 15, 2008

(54) VARIABLE BANDWIDTH ENVELOPE MODULATOR FOR USE WITH ENVELOPE ELIMINATION AND RESTORATION TRANSMITTER ARCHITECTURE AND METHOD

(75) Inventor: Esko Järvinen, Espoo (FI)

(73) Assignee: Nokia Corporation, Espoo (FI)

( * ) Notice: Subject to any disclaimer, the term of this patent is extended or adjusted under 35 U.S.C. 154(b) by 495 days.

(21) Appl. No.: 11/055,133

(22) Filed: Feb. 9, 2005

(65) Prior Publication Data

US 2006/0178119 A1 Aug. 10, 2006

(51) Int. Cl.
*H04B 1/02* (2006.01)
*H04B 1/04* (2006.01)

(52) U.S. Cl. .................. 455/114.2; 455/127.1; 455/91

(58) Field of Classification Search .............. 455/127.1, 455/114.2, 126, 91, 102, 103, 108, 116; 330/134, 330/124 R
See application file for complete search history.

(56) References Cited

U.S. PATENT DOCUMENTS

| | | | |
|---|---|---|---|
| 4,688,255 A | 8/1987 | Kahn | 381/16 |
| 5,179,302 A * | 1/1993 | Wagner | 327/553 |
| 6,049,707 A | 4/2000 | Buer et al. | 455/314 |
| 6,130,910 A | 10/2000 | Anderson et al. | 375/238 |
| 6,252,461 B1 | 6/2001 | Raab | 330/302 |
| 6,256,482 B1 | 7/2001 | Raab | 455/108 |
| 6,792,252 B2 | 9/2004 | Kimball et al. | 455/127.3 |
| 7,248,639 B2 * | 7/2007 | Rudolph et al. | 375/268 |
| 2006/0273852 A1* | 12/2006 | Chen et al. | 330/120 |
| 2007/0123184 A1* | 5/2007 | Nesimoglu et al. | 455/127.1 |

OTHER PUBLICATIONS

Frederick, H Raab et al. IEEE Transactions on Microwave Theory and Techniques "L-Band Transmitter Using Kahn EER Technique", vol. 46, No. 12 Dec. 1988—see p. 2220-2225.
Antoine Diet et al. 2004 IEEE 15TH International Symposium on Personally Indoor and Mobile Radio Communications, PWM Coding and Filtering of an OFDM Envelope Signal in a C Band EER Transmitter Architecture Sep. 5-8, vol. 3, pp. 2087-2091.
Raab, F. et al., "RF and Microwave Power Amplifier and Transmitter Technologies—Part 3", High Frequency Electronics, Sep. 2003, even pp. 34-42, 43 and even pp. 44-48.
Iwamoto, M. et al., "Bandpass delta-sigma class-S amplifier", Jun. 8, 2000, Electronics Letters, vol. 36, No. 12, pp. 1010-1012.

* cited by examiner

*Primary Examiner*—Sonny Trinh
(74) *Attorney, Agent, or Firm*—Harrington & Smith, PC

(57) ABSTRACT

A RF transmitter has at least one amplifier having an input terminal for receiving a phase modulated signal to be transmitted on an RF carrier and an input node for receiving a modulation signal for amplitude modulating the RF carrier. The RF transmitter further includes an amplitude modulator having an output coupled to the input node of the power amplifier through a low-pass filter. The low-pass filter includes at least one variable filter component for varying a bandwidth of the low-pass filter. In a preferred embodiment an envelope elimination and restoration (EER) RF transmitter includes at least one power RF amplifier having the input terminal for receiving the phase modulated signal to be transmitted on the RF carrier, and further including an input power node for receiving a modulated voltage for amplitude modulating the RF carrier. The EER RF transmitter further includes a class-S modulator having a variable bandwidth low-pass filter having an output coupled to the input power node and including at least one first variable capacitance.

29 Claims, 4 Drawing Sheets

VARIABLE BANDWIDTH ENVELOPE MODULATOR FOR USE WITH ENVELOPE ELIMINATION AND RESTORATION TRANSMITTER ARCHITECTURE AND METHOD

TECHNICAL FIELD

The embodiments of this invention relate generally to radio frequency (RF) transmitters, such as polar RF transmitters for cellular mobile stations that are embodied as envelope elimination and restoration (EER) RF transmitters, where a symbol is represented using phase and amplitude components, rather than complex In-phase/Quadrature Phase (I/Q) components, and further relate to multi-mode and multi-band polar RF transmitters.

BACKGROUND

FIG. 1A is a simplified block diagram showing an envelope restoration (ER) transmitter (TX) 1 architecture that includes an amplitude modulation (AM) chain and a phase modulation (PM) chain. Bits to be transmitted are input to a bits to polar converter 2 that outputs an amplitude signal, via propagation delay (PD) 3, to an amplitude modulator (AM) 4. The AM 4 (after digital to analog conversion) supplies a signal for controlling the output level of a TX power amplifier (PA) 6 through the use of a controllable power supply 5. The bits to polar converter 2 also outputs a phase signal via propagation delay 3 to a frequency modulator (FM) 7, which in turn outputs a signal via a phase locked loop (PLL) 8 to the input of the PA 6. The transmitted signal at an antenna 9 is thus generated by simultaneously using both phase and amplitude components. The benefits that can be gained by using the ER transmitter architecture include a small size and an improved efficiency, as compared to many conventional techniques.

Evolving digital cellular systems such as those known as Enhanced Data Rate for GSM Evolution (EDGE) and Wideband Code Division Multiple Access (WCDMA) use modulation techniques with non-constant envelopes. This makes the use of traditional transmitter architectures having a linear power amplifier (PA) inefficient and, as a result, transmitter architectures with saturated or switched mode PAs have recently become of greater interest.

One such an approach is the Kahn Envelope Elimination and Restoration (EER) technique, which combines a highly efficient but non-linear RF PA with a highly efficient envelope amplifier. General reference may be had, as an example, to U.S. Pat. No. 4,688,255, Aug. 18, 1987, "Compatible AM Broadcast/Data Transmission System", by Leonard R. Kahn.

As is shown in FIG. 1B, which is a simplified depiction of FIG. 1A, in the Kahn EER transmitter 1 the RF signal is split into a PM and an AM signal by the transmitter modulator 2. The PM signal is directly amplified by a saturated PA 6, while the supply voltage Vccrf of the PA 6 is modulated by the AM signal via amplitude modulator 5, which is provided with the battery voltage Vbatt. Modulating the supply voltage of the PA 6 has the effect of amplitude modulating the transmitted PM carrier signal The efficiency of the Kahn EER transmitter 1 is defined by the performance of the amplitude modulator 5 and the PA 6. The efficiency of the saturated or switched mode PA 6 may be greater than 70% at peak-envelope power (PEP), and it may remain high also during a back-off condition. From the several possible approaches for the realization of the amplitude modulator 5 the simplest is a linear regulator (e.g., a PNP transistor), which also provides the widest bandwidth. However, the linear regulator has poor efficiency at low envelope voltages, which tends to degrade the system performance.

From an efficiency point of view the class-S modulator (similar to a fast dc/dc-converter) is more suitable, although it is more complex. The efficiency of the class-S modulator 5 can be greater than 90%, although this figure is reduced at high clock frequencies.

By way of an introduction to the problems solved by the use of the embodiments of this invention, FIG. 2 shows a simplified block diagram of an class-S modulator 10 that feeds a switched mode power amplifier 12. The class-S modulator 10 includes transistors Q1 and Q2 driven by a driver 10A and a (fixed frequency) pulse width modulator (PWM) 10B. The class-S modulator 10 functions as a two-pole switch to generate a rectangular waveform with a switching frequency several times (typically five to seven times) that of the output signal.

General reference with regard to the use of a class-S modulator with a Kahn EER transmitter can be made to pages 40 and 42 of a publication entitled, "RF and Microwave Power Amplifier and Transmitter Technologies—Part 3", *High Frequency Electronics*, September 2003, pages 34-48. Reference may also be made to U.S. Pat. No. 6,049,707, Apr. 11, 2000, "Broadband Multi carrier Amplifier System and Method Using Envelope Elimination and Restoration", by Buer et al.

The selection of the components L1, C1 of a low-pass filter 10C is a compromise between passing a desired envelope and rejecting spurious components that are inherent in the PWM process. When using the same configuration for the systems with different modulations (e.g. GSM/EDGE) the bandwidth is defined by the modulation having the widest AM-bandwidth. This leads to a non-optimum solution for the narrowband modulation because it is possible to increase the efficiency by reducing the clock frequency and the bandwidth of the low-pass filter 10C.

From the PA 12 point of view the stability at low frequencies is the important issue if the total value of a bypass capacitance Cb at a power supply line or rail is restricted. A typical approach may use several parallel capacitors beginning with a picofarad (pF) range capacitor for RF-frequencies and ending with a value of approximately one microfarad (microF). The most critical frequencies for are typically in the range of about 10 MHz to 500 MHz, and the stability is guaranteed by a proper choice of the RF-choke Lc (typically a few nano-Henries, nH) and bypass capacitor (typically 1 nF to about 100 nF). However, in the Kahn architecture the maximum value of the bypass capacitor Cb is restricted by the envelope bandwidth to a range of about 100 nF to about 200 nF. This can cause difficulties, especially in the case where the same class-S modulator 10 is supplying several power amplifiers (low/high band).

The use of the fixed low-pass filter 10C, as shown in FIG. 2, is disadvantageous at least of the reason that its bandwidth is defined by the modulation that has the broadest AM-bandwidth, resulting in a non-optimum filtering solution for those signals with a narrower bandwidth.

SUMMARY OF THE PREFERRED EMBODIMENTS

The foregoing and other problems are overcome, and other advantages are realized, in accordance with the presently preferred embodiments of these teachings.

In one aspect this invention provides a RF transmitter having at least one amplifier comprising an input terminal for receiving a phase modulated signal to be transmitted on an RF carrier, the amplifier further comprising an input node for receiving a modulation signal for amplitude modulating the RF carrier. The RF transmitter further includes an amplitude modulator having an output coupled to the input node of the power amplifier through a low-pass filter comprised of at least one variable filter component for varying a bandwidth of the low-pass filter.

In another aspect this invention provides a multi-band RF transmitter comprising a dc to dc converter having a pulse width modulator driven by a variable frequency clock signal as a function of an amplitude modulation signal and an output for outputting a variable voltage, and a plurality of RF amplifiers individual ones of which as adapted for operation in one band of the multi-band. Each of the RF amplifiers has an input terminal for receiving a respective phase modulated signal to be transmitted on an RF carrier, and an input power node coupled to the output of the dc to dc converter through a variable bandwidth low-pass filter. Also provided are a plurality of variable bypass capacitances individual ones of which are coupled to the input power node of one of the plurality of RF amplifiers.

In a still further aspect thereof this invention provides an EER RF transmitter that includes at least one power RF amplifier comprising an input terminal for receiving a phase modulated signal to be transmitted on an RF carrier, and further comprising an input power node for receiving a modulated voltage for amplitude modulating the RF carrier. The EER RF transmitter further includes a class-S modulator comprising a variable bandwidth low-pass filter having an output coupled to the input power node and comprising at least one first variable capacitance. The EER RF transmitter further preferably comprises at least one second variable capacitance coupled to the input power node for bypassing the input power node to ground. It is preferred that values of the first and second variable capacitances are set as a function of required RF carrier bandwidth.

In another aspect thereof this invention provides a method to operate an EER RF transmitter that includes, in a first mode of operation, setting a value of at least one component of a low-pass filter of an amplitude modulator having an output coupled to an input node of a power amplifier for setting the low-pass filter to have a first bandwidth and, in a second mode of operation, setting the value of the at least one component of the low-pass filter of the amplitude modulator for setting the low-pass filter to have a second bandwidth that differs from the first bandwidth.

In yet another aspect thereof this invention provides EER RF transmitter that includes means for amplifying a phase modulated signal to be transmitted; means for amplitude modulating a voltage coupled to said amplifying means; and means for filtering said amplitude modulated voltage, comprising means for varying a bandwidth of said filtering means at least as a function of an operating mode of a communication terminal that comprises said EER RF transmitter.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Due at least to the interaction between the class-S-based amplitude modulator 5 and the PA 6, the inventor has realized that it is important to examine at their performance together to find an optimum solution from an overall system point of view. This is accomplished, in accordance with embodiments of this invention, with a high-efficiency transmitter that utilizes a polar architecture and that may be viewed as an improved derivative of the classical Kahn transmitter. The embodiments of this invention are specifically related to multimode/multiband transmitters, although these teachings are not limited for use with only such transmitters.

An aspect of this invention provides a low-pass filter having a bandwidth that is variable according to the modulation bandwidth. A further aspect of this invention changes the topology of the low-pass filter so that in the case where the modulator feeds multiple PAs, the stability can be improved without restricting the bandwidth.

Figure 1A:
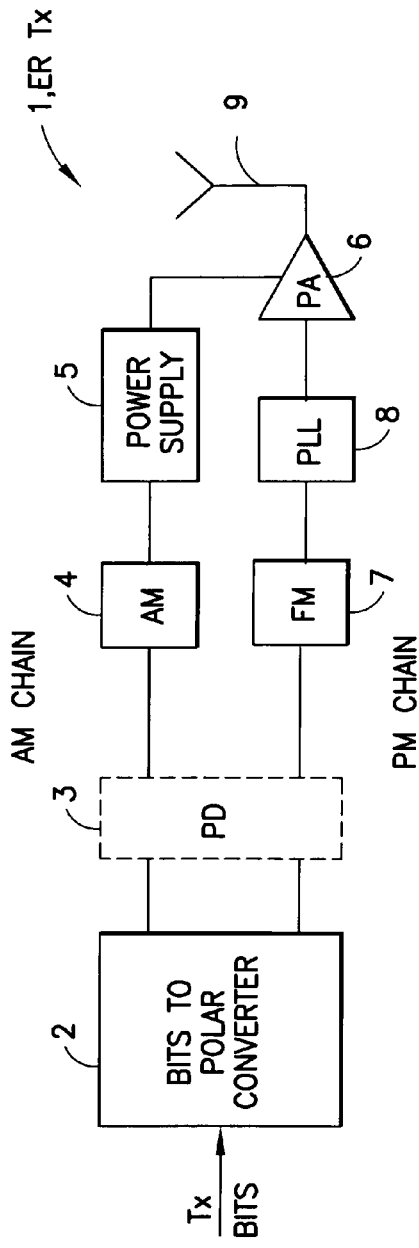
FIG. 1A is a block diagram of a conventional ER RF transmitter.
Figure 1B:
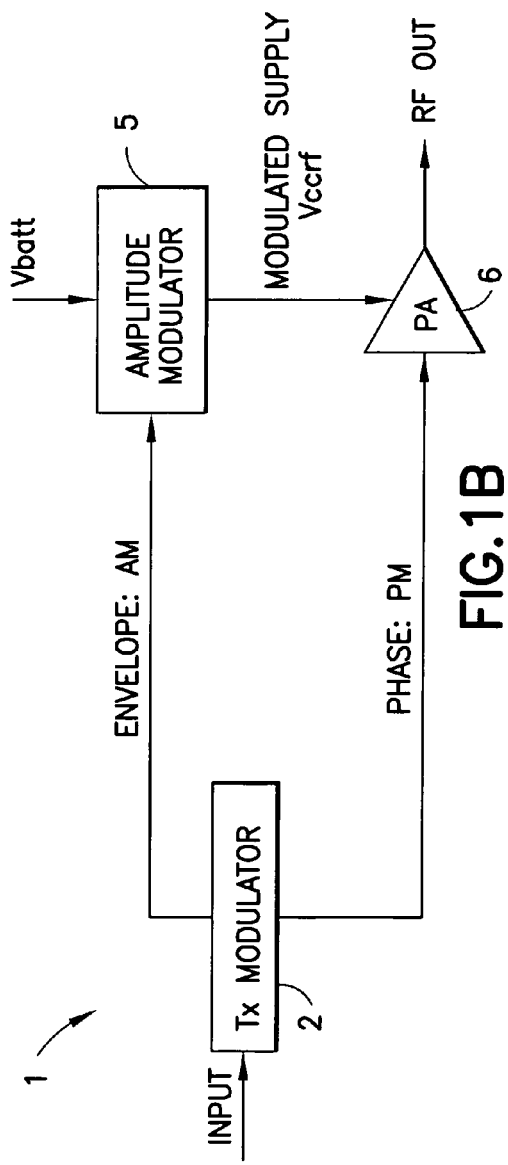
FIG. 1B is a block diagram of a conventional Kahn Envelope Elimination and Restoration (EER) transmitter.
Figure 2:
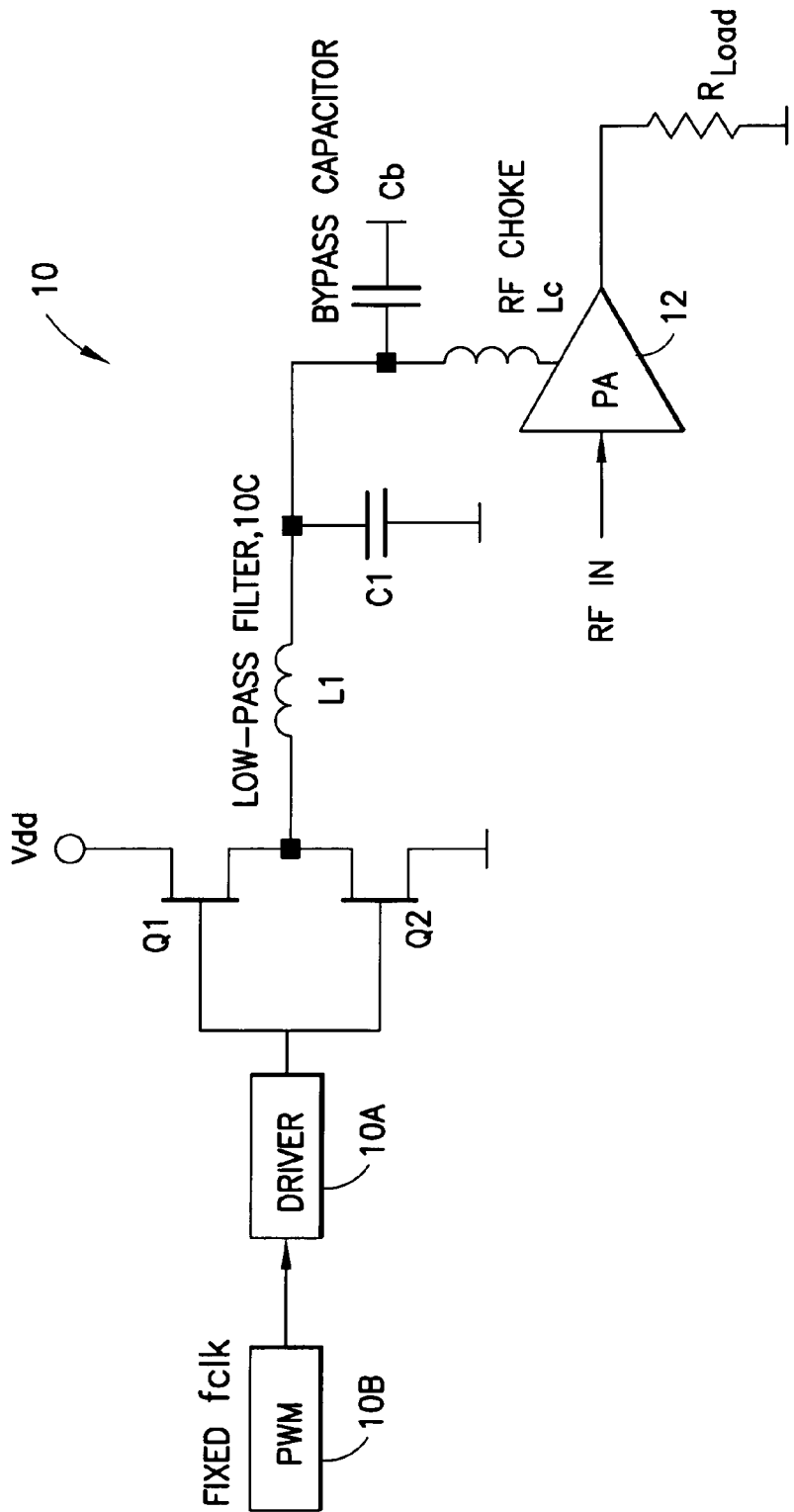
FIG. 2 is a block diagram of a Class-S modulator having a low-pass filter with a fixed clock frequency and bandwidth.
Figure 3:
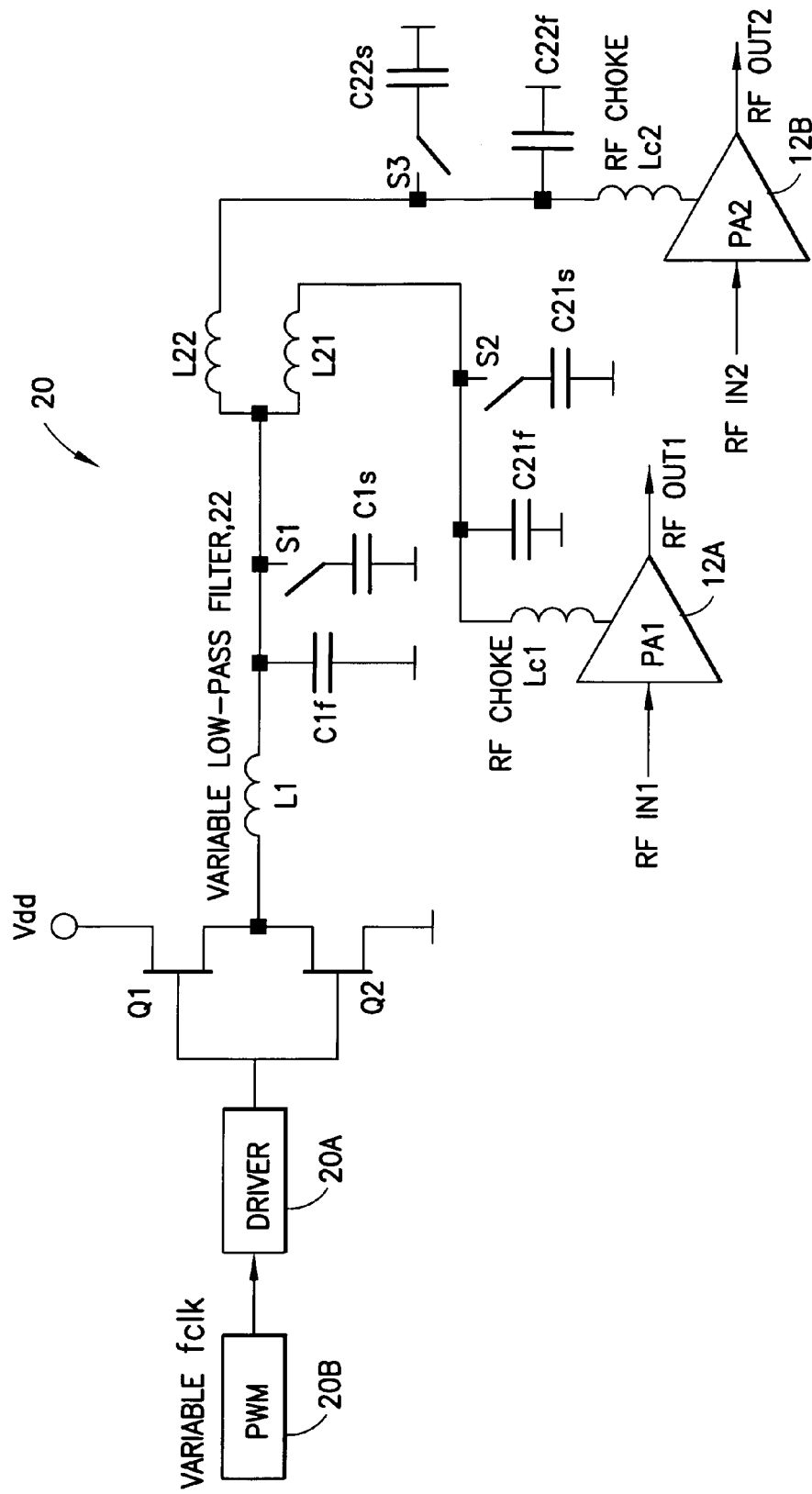
FIG. 3 is a block diagram of a Class-S modulator, in accordance with the teachings of this invention, that has a variable bandwidth low-pass filter and a variable clock frequency and that feeds a dual-band power amplifier (PA)

Reference is now made to FIG. 3 for showing a non-limiting embodiment of an improved modulator, shown as a class-S modulator 20, characterized at least in part by having a variable bandwidth output filter, preferably embodied as a variable bandwidth two-stage low-pass filter 22. Also included is a variable clock frequency (fclk) PWM 20B that feeds a driver 20A, that in turn drives transistors Q1 and Q2.

The variable two-stage low-pass filter 22 provides additional freedom to fulfill the bandwidth and stability requirements as compared to the conventional fixed bandwidth, one-stage low-pass filter 10C. A part of the low-pass filter capacitance may be realized with at least one capacitor having a fixed value (C1f) and at least one variable capacitor (C1s) that is connectable in parallel with C1f using switch S1. The value of the RF-chokes Lc1, Lc2 is typically so low that it does not significantly affect on the bandwidth. Fixed decoupling capacitors C21f and C22f are primarily used to bypass RF frequencies. The stability of the PAs 12A, 12B is guaranteed in the low MHz-range by a proper choice of the variable decoupling capacitors C21s and C22s connectable in parallel with C21f and C22f, respectively, using switches S2 and S3, respectively. It is preferred to switch C21s on and C22s off when PA1 12A is on, and to operate in the opposite way when PA2 12B is on. This provides enhanced stability with a restricted value of the bypass capacitor.

In practice, the variable capacitance can be realized by using several controllable capacitors in parallel as shown, or by any suitable means to provide a controllably variable value of capacitance at the node coupled to the supply inputs of PA1 12A and PA2 12B and/or the node coupled to the output of Q1/Q2. In other embodiments of this invention all of the capacitances for either the low-pass filter and/or the decoupling may be variable capacitances, i.e., the use of at least one fixed capacitance maybe eliminated. In other embodiments of this invention the variable capacitances may be electronically controlled, such as by providing a varactor in place of, e.g., switch S1 and C1s, and providing a variable control voltage to the varactor(s) to vary the capacitance thereof.

When the envelope bandwidth is narrow then it becomes possible to switch all of the capacitors on (C1s and possibly also C22s), and to simultaneously reduce the clock frequency to improve the efficiency of the modulator 20. For modulation with a wider bandwidth some or all of the variable capacitors may be turned off, such as by opening S2 and S3.

The switches S1, S2 and S3 may be implemented by using several suitable technologies, such as Micro-Electro-Mechanical System (MEMS) or semiconductor devices. Since switch losses are generally not particularly critical it is preferred to implement the switches S1, S2, S3 using the same integrated circuit fabrication process that is used for implementing the class-S modulator 20 (fast dc/dc-converter).

An exemplary and non-limiting example of the FIG. 3 embodiment is now provided with representative carrier frequencies, bandwidths, clock frequencies and component values for the various inductors and capacitances. Assuming the use of GSM (900 MHz, GMSK modulation), EDGE (900 MHz, 8-PSK modulation) and WCDMA (1900 MHz, QPSK modulation) operating modes the following component values are representative:

GSM: fclk=1 MHz, L1=1 microHenry, C1, total=1-10 microFarads, BW~50 kHz;
EDGE: fclk=10 MHz, L1=1 microHenry, C1, total=0.5 microFarads, BW~300 kHz; and
WCDMA: fclk=100 MHz, L1=1 microHenry, C1, total=3 nanoFarads, BW~3 MHz.

Note that from a PA 12 stability point of view the values of C1, total or L1 may need to be optimized for the WCDMA case, while in GMSK/EDGE case the values of L1 and C1, total are practical. In this case C1$f$ may be 0.5 microFarads and C1s maybe about 0.5-9.5 microFarads.

The values of L21 and L22 may be in the range of a few tenths of a nanoHenry. C21$f$ and C22$f$ may be 100 picoFarads and C21s and C22s may be in a range of from about 10 nanoFarads to 100 nanoFarads. Rf-chokes Lc1 and Lc2 may have values in the range of about 5 nanoHenry to 15 nanoHenry, and may in some applications be realized by using transmission lines (microstrip).

It is preferred, although not a limitation upon the practice of the embodiments of this invention, to maintain a constant value of L1, as it is generally more difficult to realize a switchable inductance than a switchable capacitance. However, when using transmission lines for realizing L1 it may be preferred to employ surface mount device (SMD) discrete coils that may be selectively coupled together using a switch or switches to realize different values of total inductance. It is also within the scope of this invention to employ both switched capacitance (or other types of variable capacitance) in combination with a switched inductance for varying both the capacitance and the inductance of the low-pass filter 22.

Figure 4:
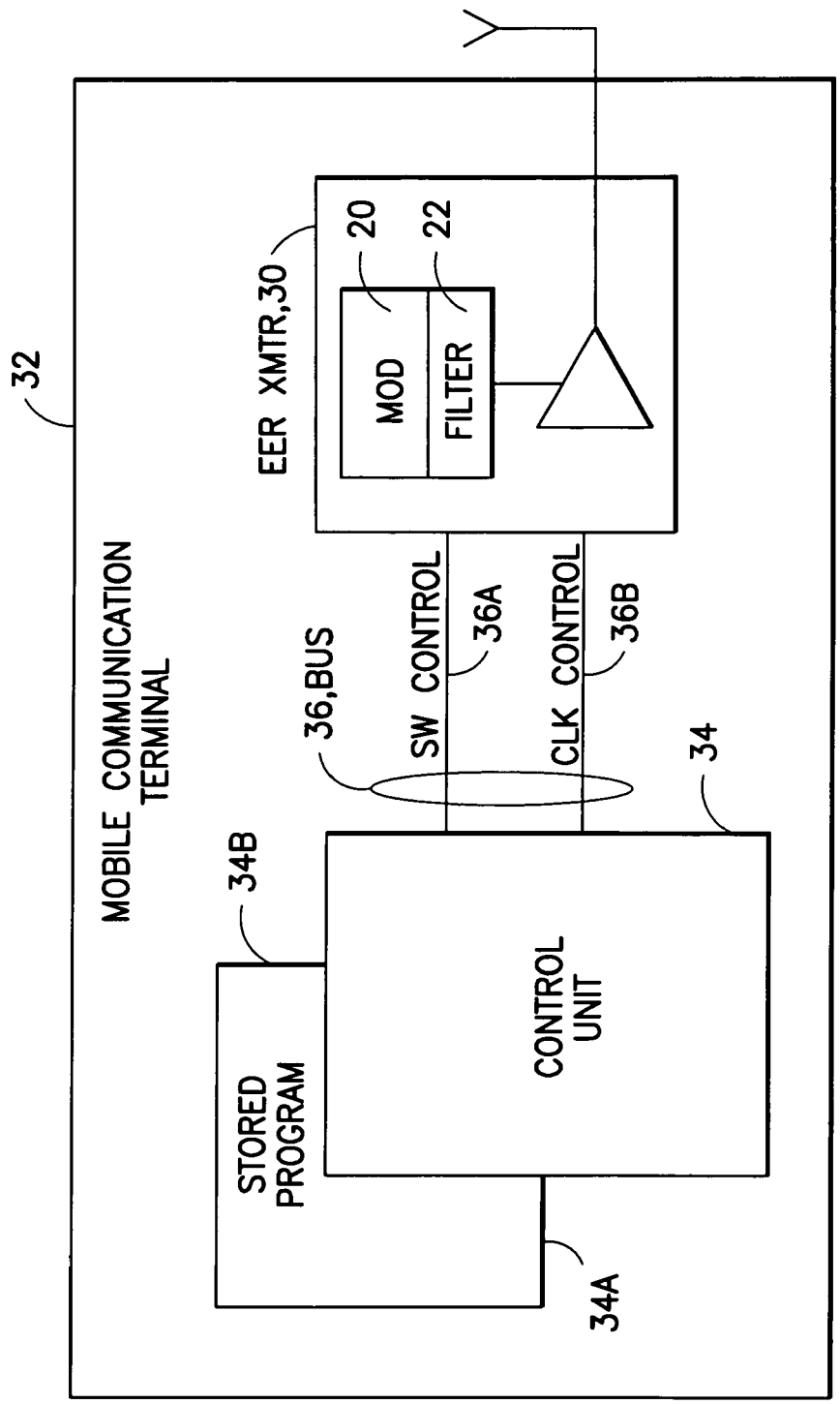
FIG. 4 shows an embodiment of an EER transmitter that includes the variable bandwidth Class-S modulator of FIG. 3.

FIG. 4 shows an embodiment of an EER transmitter 30 that includes the variable class-S modulator 20 of FIG. 3. The EER transmitter 30 may be installed in a mobile communication terminal 32, such as a cellular telephone. The terminal 32 also includes a control unit 34, such as a discrete or ASIC-embedded microprocessor, that is coupled through a control bus 36 to the EER transmitter 30. At least one signal line of the control bus 36 is a switch control line 36A for controlling the states of the switches S1, S2 and S3 at least as a function of the current operating band/mode of the terminal 32. At least one other signal line of the control bus 36 may be a clock frequency control line 36B for use in establishing the output frequency (Fclk) of the PWM 20B, again at least as a function of the current operating band/mode. It is assumed that the control unit operates in accordance with a stored program 34A that directs the operation of the control unit 34 in accordance with the embodiments of this invention for exerting control over the variable class-S modulator 20, as discussed above.

The use of the embodiments of this invention improves the performance of the polar EER transmitter 30 used in multi-band/mode systems. The fast dc/dc converter in the EER transmitter 30 may also be used in an envelope tracking mode and in a static control mode, where Vcc is adjusted according to the average output power (Pout). It is also advantageous in these applications to vary the value of the clock frequency and the bandwidth of the low-pass filter 22.

The foregoing description has provided by way of exemplary and non-limiting examples a full and informative description of the best method and apparatus presently contemplated by the inventor for carrying out the invention. However, various modifications and adaptations may become apparent to those skilled in the relevant arts in view of the foregoing description, when read in conjunction with the accompanying drawings and the appended claims. For example, the teachings in accordance with this invention can be used with single band/single mode transmitters, as well as with dual-band/dual-mode and tri-band/tri-mode (and higher) transmitters. In general, all such and similar modifications of the teachings of this invention will still fall within the scope of the embodiments of this invention.

Further still, some of the features of the present invention could be used to advantage without the corresponding use of other features. As such, the foregoing description should be considered as merely illustrative of the principles of the present invention, and not in limitation thereof.

What is claimed is:

1. A apparatus, comprising:
   at least one amplifier comprising an input terminal for receiving a phase modulated signal to be transmitted on an RF carrier, said at least one amplifier further comprising an input node for receiving a modulation signal for amplitude modulating the RF carrier; and
   an amplitude modulator having an output configurable to be connected with the input node of said at least one amplifier, the output of said amplitude modulator being filtered using a low-pass filter comprised of at least one variable filter component for varying a bandwidth of the low-pass filter;
   where the input node of said at least one amplifier comprises a power input node, and where said amplitude modulator is comprised of a variable frequency pulse width modulator comprising a part of a dc to dc converter for supplying operating power to said power input node.

2. An apparatus as in claim 1, further comprising at least one variable bypass capacitance configurable to be connected with said input node.

3. An apparatus as in claim 1, where said at least one variable filter component is comprised of a capacitance that is configurable to be switchably connected with said output of said amplitude modulator.

4. An apparatus as in claim 1, further comprising at least one bypass capacitance that is configurable to be switchably connected with said input node.

5. A RF transmitter as in claim 1, embodied at least partially in an integrated circuit.

6. An apparatus as in claim 1, having a polar architecture.

7. An apparatus as in claim 1, embodied as an envelope elimination and restoration transmitter.

8. An apparatus, comprising:
   a plurality of amplifiers each comprising an input terminal for receiving a phase modulated signal to be transmitted on an RF carrier, each of said plurality of amplifiers further comprising an input node for receiving a modulation signal for amplitude modulating the RF carrier; and an amplitude modulator having an output configurable to be connected with the input node of each of said plurality of amplifiers, the output of said amplitude modulator being filtered using a low-pass filter comprised of at least one variable filter component for varying a bandwidth of the low-pass filter;

further comprising a plurality of variable bypass capacitances individual ones of which are configurable to be connected with said input node of an individual one of said plurality of amplifiers.

9. An apparatus as in claim 8, embodied at least partially in an integrated circuit.

10. An apparatus as in claim 8, having a polar architecture.

11. An apparatus as in claim 8, embodied as an envelope elimination and restoration transmitter.

12. An apparatus, comprising:
at least one power RE amplifier comprising an input terminal for receiving a phase modulated signal to be transmitted on an RE carrier and further comprising an input power node for receiving a modulated voltage for amplitude modulating the RE carrier; and
a class-S modulator comprising a variable bandwidth low-pass filter having an output configurable to supply a filtered signal to said input power node and comprising at least one first variable capacitance;
where said class-S modulator is comprised of a variable frequency pulse width modulator comprising a part of a dc to dc converter for supplying operating power to said input power node.

13. The apparatus as in claim 12, further comprising at least one second variable capacitance configurable to be connected with said input power node for bypassing said input power node to ground.

14. The apparatus as in claim 13, where values of said first and second variable capacitances are set as a function of required bandwidth.

15. The apparatus as in claim 12, embodied in a mobile communication terminal.

16. An apparatus as in claim 12, embodied at least partially in an integrated circuit.

17. An apparatus as in claim 12, embodied as a transmitter having a polar architecture.

18. An apparatus as in claim 12, embodied as an envelope elimination and restoration transmitter.

19. A method comprising:
in a first mode of operation, setting a value of at least one component of a low-pass filter of an amplitude modulator, said amplitude modulator having an output configurable to be connected with an input node of a power amplifier, where setting the value causes the low-pass filter to have a first bandwidth; and in a second mode of operation, setting the value of the at least one component of the low-pass filter of the amplitude modulator for setting the low-pass filter to have a second bandwidth that differs from the first bandwidth;

where in both the first mode of operation and the second mode of operation further comprising operating the amplitude modulator as a variable frequency pulse width modulator that comprises part of a dc to dc converter configurable to output operating power to the power amplifier.

20. A method as in claim 19, where the steps of setting are performed by a control unit of a communication terminal operating under control of a stored program.

21. A method as in claim 19, where setting the value sets the value of at least one capacitance.

22. A method as in claim 19, where setting the value sets the value of at least one inductance.

23. A method as in claim 19, where setting the value sets the state of at least one switch that comprises part of a switched capacitance network.

24. An apparatus, comprising:
means for amplifying a phase modulated signal to be transmitted;
means for amplitude modulating a voltage, comprising variable frequency pulse width modulator means comprising a part of dc to dc converter means configurable to output amplifying means operating power; and
means for filtering said amplitude modulated voltage prior to said amplitude modulated voltage being applied to a power input node of said amplifying means, comprising means for varying a bandwidth of said filtering means at least as a function of an operating mode of a communication terminal that comprises said apparatus.

25. An apparatus as in claim 24, where said varying means comprises means for setting a value of at least one of a capacitance and an inductance that comprises part of said means for filtering.

26. An apparatus as in claim 24, embodied at least partially in an integrated circuit.

27. An apparatus as in claim 24, embodied as a transmitter having a polar architecture.

28. An apparatus as in claim 24, embodied as an envelope elimination and restoration transmitter.

29. An apparatus as in claim 24, where the operating mode is selected from at least two operating modes each using a different type of modulation.

* * * * *

UNITED STATES PATENT AND TRADEMARK OFFICE
CERTIFICATE OF CORRECTION

PATENT NO. : 7,400,865 B2 Page 1 of 1
APPLICATION NO. : 11/055133
DATED : July 15, 2008
INVENTOR(S) : Jarvinen It is certified that error appears in the above-identified patent and that said Letters Patent is hereby corrected as shown below:

In Claim 12: Column 7, line 21, delete "RE" and replace with --RF--.

In Claim 12: Column 7, line 23, delete "RE" and replace with --RF--.

In Claim 12: Column 7, line 25, delete "RE" and replace with --RF--.

Signed and Sealed this

Twenty-first Day of October, 2008

JON W. DUDAS
*Director of the United States Patent and Trademark Office*